US007816763B2

(12) United States Patent
Kim

(10) Patent No.: US 7,816,763 B2
(45) Date of Patent: Oct. 19, 2010

(54) BJT AND METHOD FOR FABRICATING THE SAME

(75) Inventor: Nam Joo Kim, Yongin-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 358 days.

(21) Appl. No.: 11/930,592

(22) Filed: Oct. 31, 2007

(65) Prior Publication Data

US 2008/0157280 A1 Jul. 3, 2008

(30) Foreign Application Priority Data

Dec. 27, 2006 (KR) ..................... 10-2006-0134635

(51) Int. Cl.
*H01L 23/48* (2006.01)

(52) U.S. Cl. ............... 257/565; 257/477; 257/E29.114; 257/E21.538; 257/E21.537; 257/773; 438/335; 438/370

(58) Field of Classification Search ................. 438/370, 438/335, 357; 257/477, 474, 479, 565, E29.114, 257/E21.538, E21.537
See application file for complete search history.

(56) References Cited

U.S. PATENT DOCUMENTS 4,910,572 A * 3/1990 Kameyama ................. 257/508
5,187,554 A * 2/1993 Miwa ......................... 257/586
2005/0020023 A1* 1/2005 Lachner ...................... 438/311

FOREIGN PATENT DOCUMENTS

JP 59182536 A * 10/1984
JP 02-152241 12/1990

OTHER PUBLICATIONS

Office Action from the Korean Patent Office on Dec. 18, 2007, in corresponding Application No. 10-2006-0134635 (3 pages).

* cited by examiner

*Primary Examiner*—Kenneth A Parker
*Assistant Examiner*—Jose R Diaz
(74) *Attorney, Agent, or Firm*—Finnegan, Henderson, Farabow, Garrett & Dunner, L.L.P.

(57) ABSTRACT

According to one embodiment, a collector electrode including metal is used for a sink region for connecting an n+ type buried layer, so that the sink region can be narrowly formed. Further, an interval between a base region and the collector electrode can be reduced, thereby considerably decreasing the size of the transistor. Furthermore, collector resistance is reduced, so that the performance of the transistor can be improved.

5 Claims, 5 Drawing Sheets

115 116 117 112 104 103 110 111 102 101 105 106

BJT AND METHOD FOR FABRICATING THE SAME

The present application claims priority under 35 U.S.C. 119 and 35 U.S.C. 365 to Korean Patent Application No. 10-2006-0134635 (filed on Dec. 27, 2006), which is hereby incorporated by reference in its entirety.

TECHNICAL FIELD

The embodiment relates to a bipolar transistor and a method of fabricating the same.

In general, since a BJT (bipolar junction transistor) has high current driving performance and high operation speed as compared with a MOS field effect transistor, the BJT has been widely used for specific parts of each product instead of the MOS field effect transistor.

In addition, in order to achieve high speed data processing and high performance, a complementary bipolar transistor has been used, in which both a PNP BJT and an NPN BJT are integrated on a silicon substrate.

FIG. 1A is a plan view showing a bipolar transistor and FIG. 1B is a sectional view showing the bipolar transistor taken along line II-II in FIG. 1A.

As shown in FIGS. 1A and 1B, the bipolar transistor includes an n+ type buried layer 12 formed in the surface of a silicon substrate 11, an epitaxial layer 13 formed on the entire surface of the silicon substrate 11 including the n+ type buried layer 12, an n− type well 14 formed in the surface of the epitaxial layer 13, base and emitter regions 15 and 16 formed in the surface of the epitaxial layer 13 and spaced apart from each other by a predetermined interval, an n+ type diffusion region 17 formed in the surface of the epitaxial layer 13 to be connected to the n+ type buried layer 12, an interlayer dielectric layer 18 formed on the entire surface of the silicon substrate 11 including the epitaxial layer 13, and base, emitter and collector electrodes 19 to 21 connected to the base region 15, the emitter region 16, and the n+ type diffusion region 17 through the interlayer dielectric layer 18, respectively.

The n+ type buried layer 12 is used as a collector region.

However, the NPN bipolar transistor according to the prior art as described above has the following problems.

That is, when forming the collector, the n+ type buried layer 12 and the surface of the silicon substrate 11 are connected to the high density n+ type diffusion region 17 referred to as a sink. This sink is subject to heat treatment and n-type high density ion implantation in order to connect with the n+ type buried layer 12 under the epitaxial layer 13 from the upper portion of the silicon substrate 11. In such a case, junction extends in the side direction thereof corresponding to a depth of a lower portion thereof. Further, the sink causes an internal pressure problem with a base junction, so a predetermined distance must be maintained. Therefore, when the sink is used for the junction, the size of the transistor is increased due to such problems.

SUMMARY

Disclosed in the application is an embodiment providing a bipolar transistor, in which a trench and a metal layer are formed between an n+ type buried layer and the surface of a silicon substrate, so that an RC can be decreased and simultaneously the size of the transistor can be reduced, and a method of fabricating the same.

In order to accomplish the object of the embodiment, there is provided a bipolar transistor comprising: a first conductive buried layer in a surface of a silicon substrate; an epitaxial layer on the silicon substrate including the first conductive buried layer; base and emitter regions in a surface of the epitaxial layer, in which the base and emitter regions are spaced apart from each other by a predetermined interval; an opening formed by selectively removing the epitaxial layer such that a surface of the first conductive buried layer is partially exposed; a first conductive diffusion region in a surface of the first conductive buried layer corresponding to the opening; an interlayer dielectric layer formed on an entire surface of the silicon substrate; contact holes formed by selectively removing the interlayer dielectric layer such that the surfaces of the base region, the emitter region and the first conductive diffusion region are exposed; and base, emitter and collector electrodes electrically connected to the base region, the emitter region, and the first conductive diffusion region through the contact holes, respectively.

In order to accomplish the object of the embodiment, there is provided a method of fabricating a bipolar transistor, the method comprising the steps of: forming a first conductive buried layer in a surface of a silicon substrate; forming an epitaxial layer on the silicon substrate including the first conductive buried layer; forming base and emitter regions in a surface of the epitaxial layer, in which the base and emitter regions are spaced apart from each other by a predetermined interval; forming an opening by selectively removing the epitaxial layer such that a surface of the first conductive buried layer is partially exposed; forming a first conductive diffusion region in a surface of the first conductive buried layer corresponding to the opening; forming an interlayer dielectric layer on an entire surface of the silicon substrate; and forming contact holes by selectively removing the interlayer dielectric layer such that the surfaces of the base region, the emitter region and the first conductive diffusion region are exposed.

DETAILED DESCRIPTION

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, a number of variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Hereinafter, a bipolar transistor and a method for fabricating the same according to an embodiment will be described with reference to the accompanying drawings.

Figure 1A:
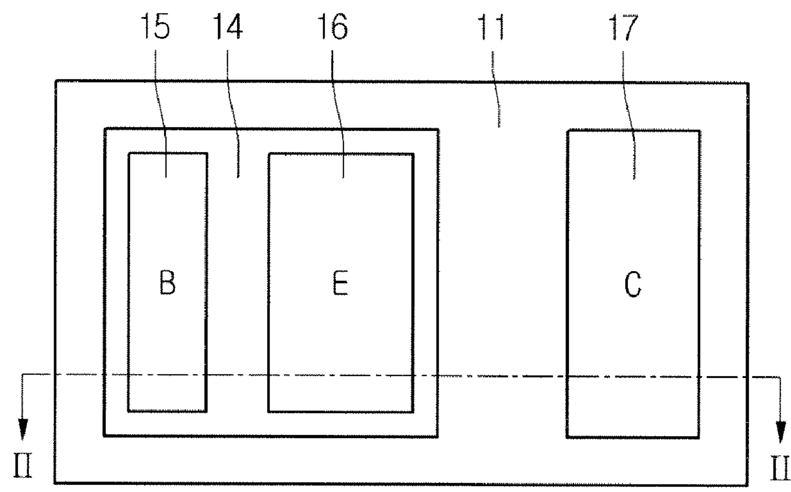
FIG. 1A is a plan view showing a bipolar transistor according to one embodiment.
Figure 1B:
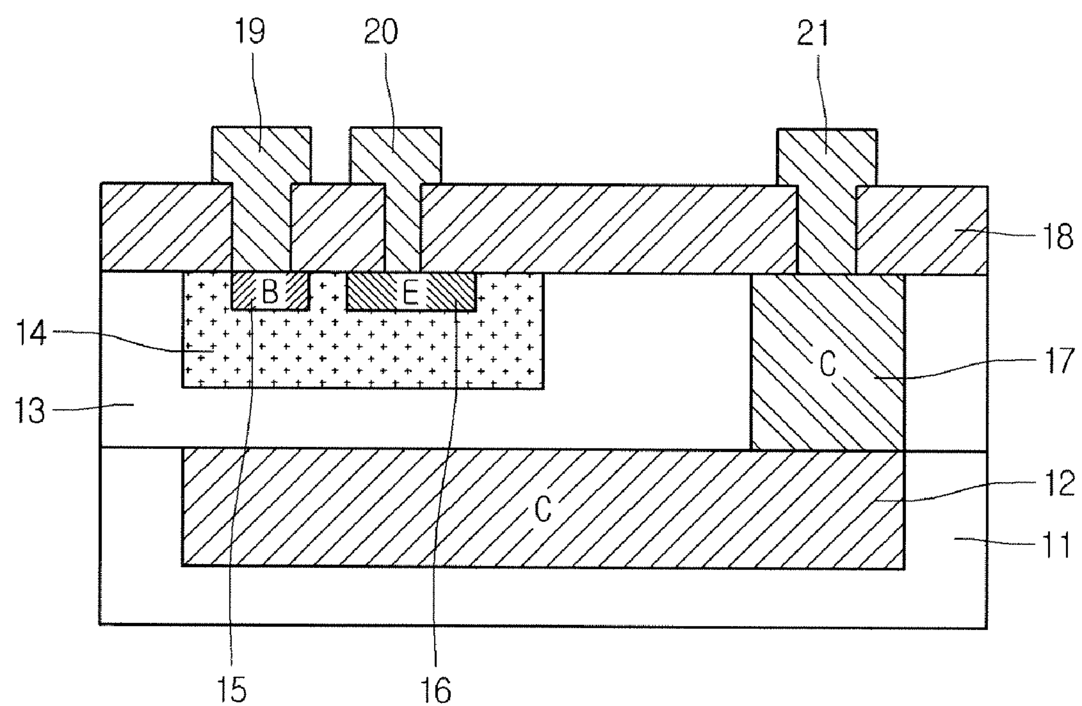
FIG. 1B is a sectional view showing the bipolar transistor taken along line II-II in FIG. 1A according to one embodiment.
Figure 2:
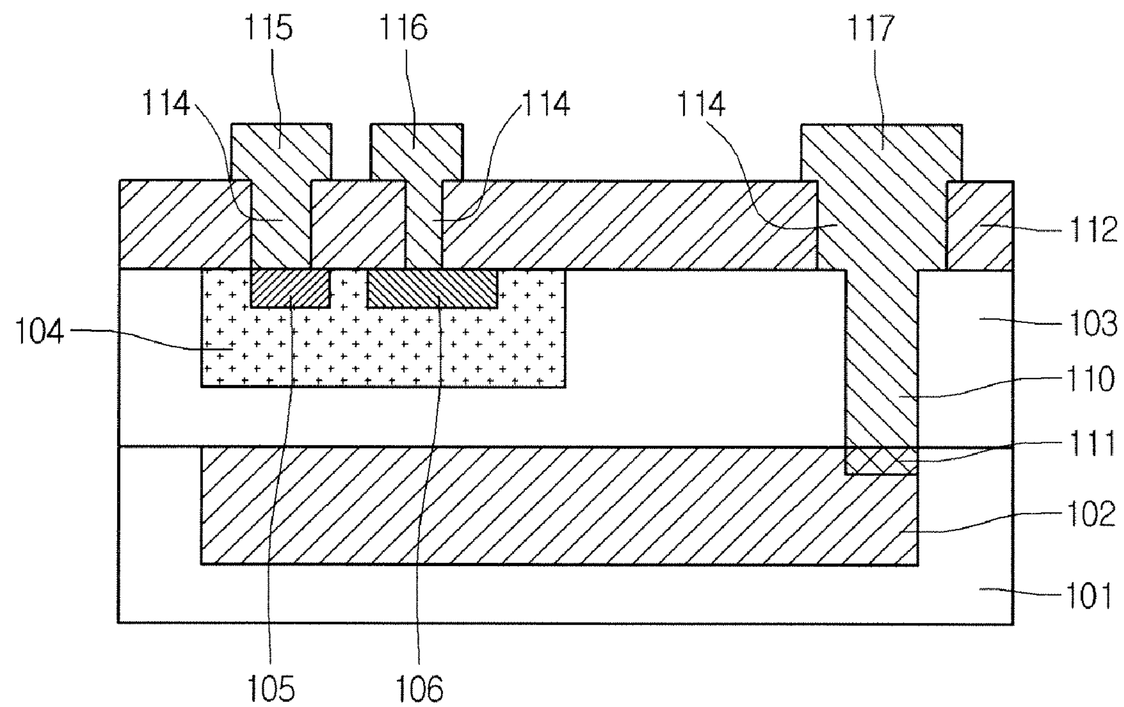
FIG. 2 is a sectional view showing a bipolar transistor according to one embodiment.

FIG. 2 is a sectional view showing a bipolar transistor according to one embodiment.

As shown in FIG. 2, the bipolar transistor includes an n+ type buried layer 102 formed in the surface of a silicon substrate 101, an epitaxial layer 103 formed on the silicon substrate 101 including the n+ type buried layer 102, an n− type well 104 formed in the surface of the epitaxial layer 103, base and emitter regions 105 and 106 formed in the surface of the epitaxial layer 103 and spaced apart from each other by a predetermined interval, an opening 110 formed by selectively removing the epitaxial layer 103 such that the surface of the n+ type buried layer 102 is partially exposed, an n+ type diffusion region 111 formed in the n+ type buried layer 102 corresponding to the opening 110, an interlayer dielectric layer 112 formed on the entire surface of the silicon substrate 101, contact holes 114 formed by selectively removing the interlayer dielectric layer 112 such that the surfaces of the base regions 105, the emitter region 106 and the n+ type diffusion region 111 are exposed, and base, emitter and collector electrodes 115 to 117 electrically connected to the base region 105, the emitter region 106, and the n+ type diffusion region 111 through the contact holes 114, respectively.

FIGS. 3A to 3G are sectional views sequentially showing the procedure for fabricating the bipolar transistor according to one embodiment.

Figure 3A:
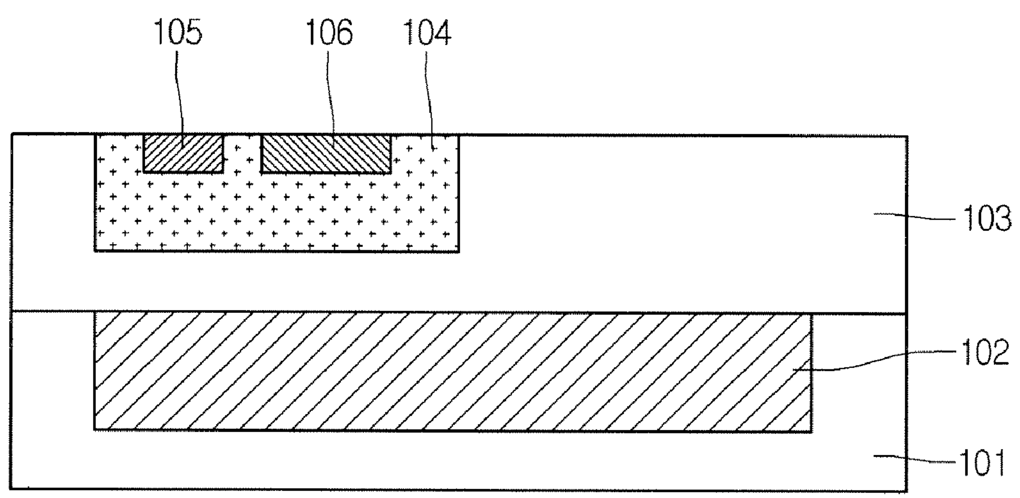
FIGS. 3A to 3G are sectional views sequentially showing the procedure for fabricating a bipolar transistor according to one embodiment.

As shown in FIG. 3A, n+ type impurity ions are selectively implanted into the silicon substrate 101 to form the n+ type buried layer 102 with a predetermined width in the surface of the silicon substrate 101.

Then, the silicon substrate 101 is epitaxially grown to form the epitaxial layer 103 thereon.

Next, low density n− type impurity ions are selectively implanted into the epitaxial layer 103 to form the n− type well 104 with a predetermined width in the surface of the epitaxial layer 103.

Thereafter, n and p type impurity ions are selectively implanted into the epitaxial layer 103 to form the n+ type base and p+ type emitter regions 105 and 106 spaced apart from each other by a predetermined interval.

Figure 3B:
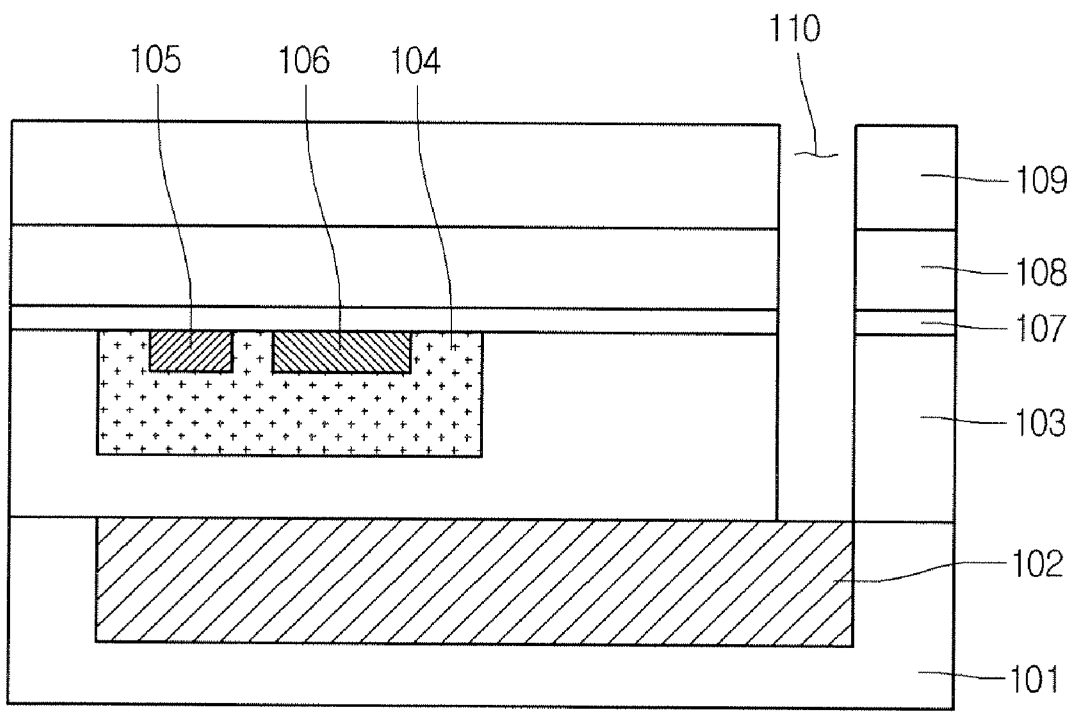

As shown in FIG. 3B, oxide and nitride layers 107 and 108 are sequentially formed on the entire surface of the silicon substrate 101, and a first photoresist 109 is coated on the nitride layer 108.

Then, the first photoresist 109 is selectively patterned through exposure and development processes to define a collector sink region.

Next, the nitride and oxide layers 108 and 107 are selectively removed using the patterned photoresist 109 as a mask, and then the epitaxial layer 103 is selectively removed such that the surface of the n+ type buried layer 102 is partially exposed, thereby forming the opening 110.

Figure 3C:
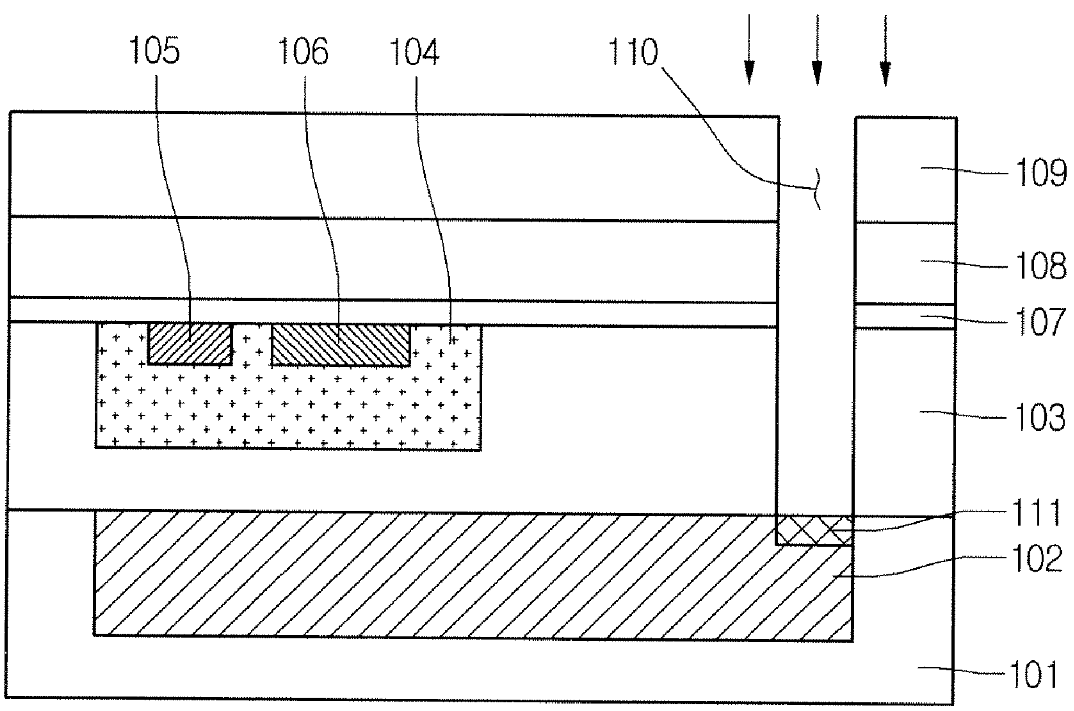

As shown in FIG. 3C, high density n type impurity ions are implanted into the entire surface of the silicon substrate 101 by using the nitride and oxide layers 108 and 107, inclusive of the first photoresist 109, as a mask, thereby forming the n+ type diffusion region 111 with a predetermined depth in the surface of the n+ type buried layer 102 in the opening 110.

Figure 3D:
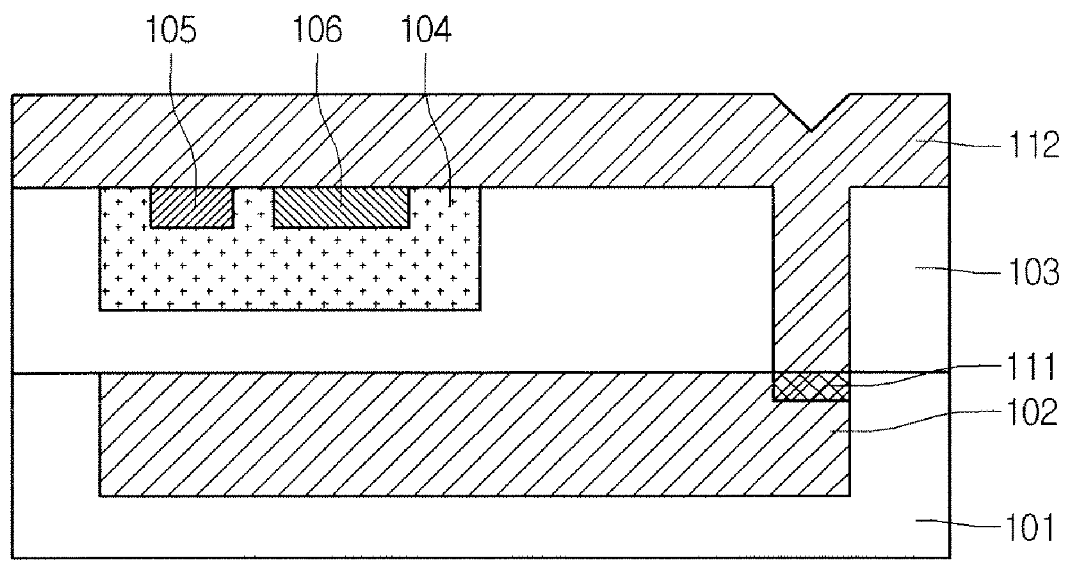

As shown in FIG. 3D, the first photoresist 109, and the nitride and oxide layers 108 and 107 are removed, and the silicon substrate 101 is cleaned, so that particles generated during the processes are removed.

Then, the interlayer dielectric layer 112 is formed on the entire surface of the silicon substrate 101.

Figure 3E:
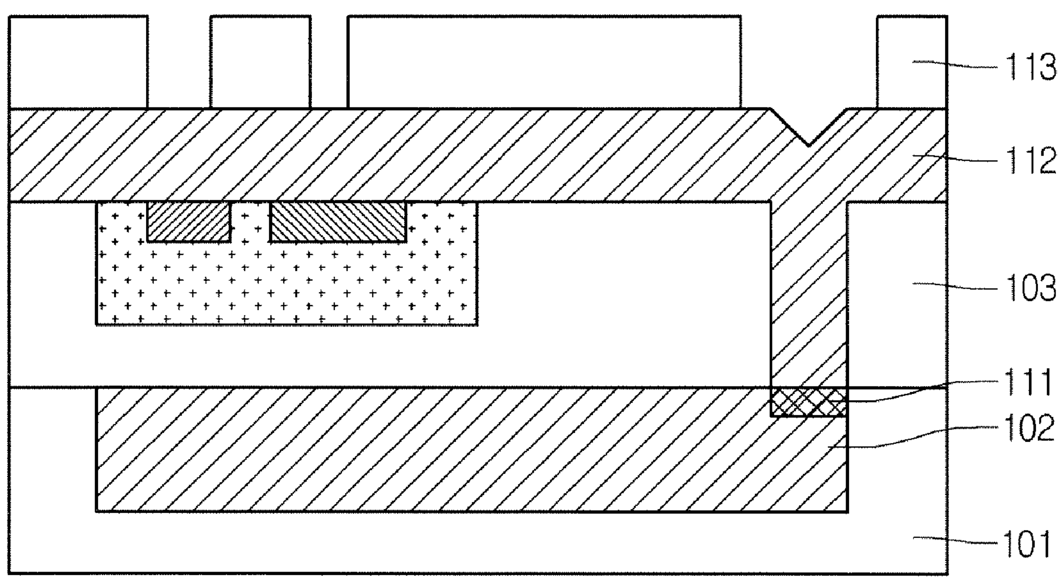

As shown in FIG. 3E, a second photoresist 113 is coated on the interlayer dielectric layer 112, and is selectively patterned through exposure and development processes to define each electrode region.

Figure 3F:
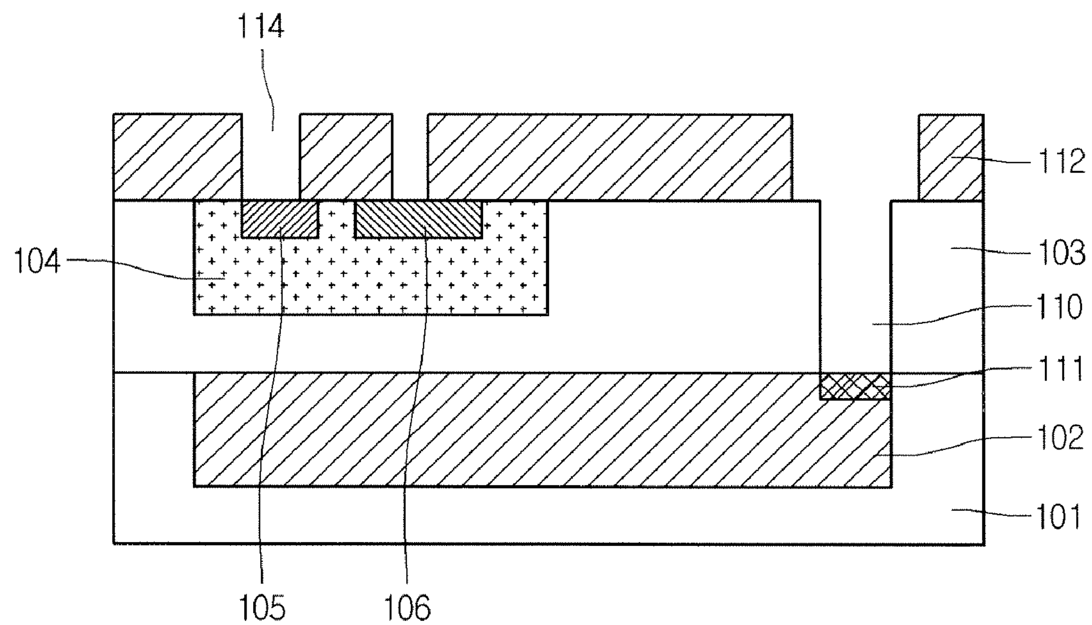

As shown in FIG. 3F, the interlayer dielectric layer 112 is selectively removed using the patterned photoresist 113 as a mask such that the surfaces of the base region 105, the emitter region 106 and the n+ type diffusion region 111 are exposed, thereby forming the contact holes 114.

The contact hole 114 that exposes the surface of the n+ type diffusion region 111 has a wider width while corresponding to the opening 110.

Figure 3G:
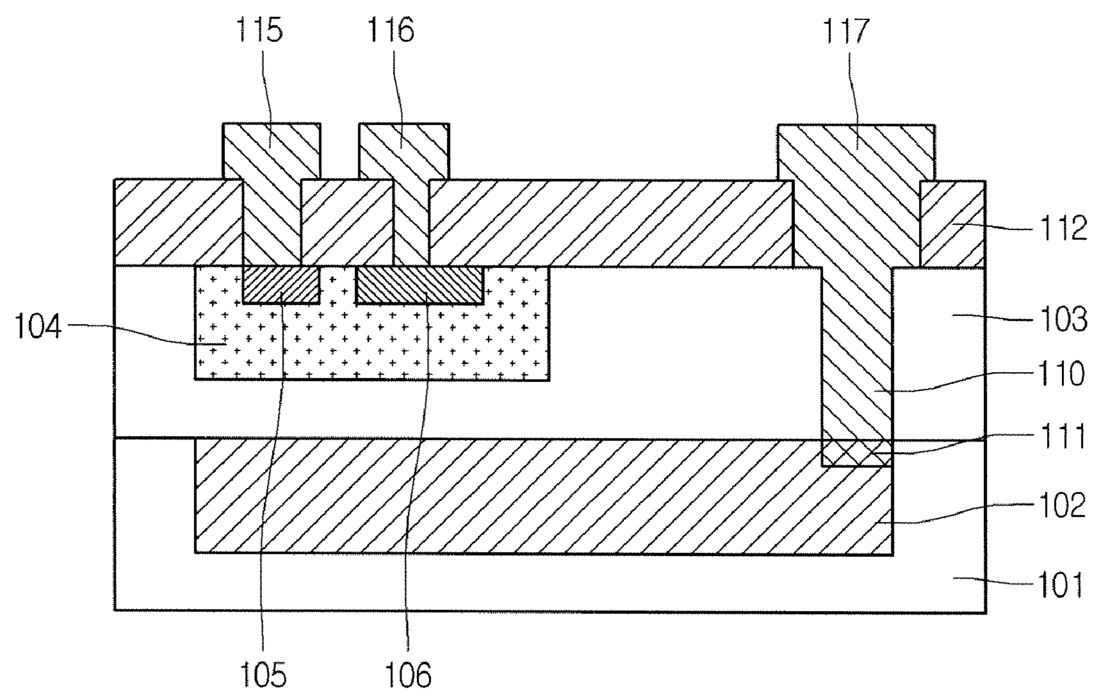

As shown in FIG. 3G, the second photoresist 113 is removed, and a metal layer is deposited on the entire surface of the silicon substrate 101. Then, the metal layer is selectively removed through photo and etching processes to form the base, emitter and collector electrodes 115 to 117 electrically connected to the base region 105, the emitter region 106 and the n+ type diffusion region 111 through the contact holes 114.

According to a bipolar transistor and a method for fabricating the same of the embodiment as described above, the following effects can be achieved.

First, the sink region for connecting the n+ type buried layer is formed using metal instead of junction, so that the sink region can be narrowly formed.

Second, an interval with the base can be reduced, so that the size of the transistor can be considerably decreased.

Last, collector resistance is reduced, so that the performance of the transistor can be improved.

Although an embodiment has been described with reference to a number of illustrative embodiments thereof, it should be understood that numerous other modifications and embodiments can be devised by those skilled in the art that will fall within the spirit and scope of the principles of this disclosure.

What is claimed is:

1. A bipolar transistor comprising:

a first conductive buried layer in a surface of a silicon substrate;

an epitaxial layer on the silicon substrate including the first conductive buried layer;

base and emitter regions in a surface of the epitaxial layer, in which the base and emitter regions are spaced apart from each other by a predetermined interval;

an opening formed by selectively removing the epitaxial layer such that a surface of the first conductive buried layer is partially exposed;

a first conductive diffusion region in a surface of the first conductive buried layer corresponding to the opening;

an interlayer dielectric layer formed on an entire surface of the silicon substrate;

contact holes formed simultaneously by selectively removing the interlayer dielectric layer such that the surfaces of the base region, the emitter region, and the first conductive diffusion region are exposed; and base, emitter, and collector electrodes electrically connected to the base region, the emitter region, and the first conductive diffusion region through the contact holes, respectively;

wherein:

the contact hole for the collector electrode has a width wider than a width of the opening and the remaining contact hole, and forms a step structure.

2. The bipolar transistor as claimed in claim 1, wherein a width of the collector electrode in the contact hole is wider than a width of the collector electrode in the opening.

3. A method of fabricating a bipolar transistor, the method comprising the steps of:

forming a first conductive buried layer in a surface of a silicon substrate;

forming an epitaxial layer on the silicon substrate including the first conductive buried layer;

forming base and emitter regions in a surface of the epitaxial layer, in which the base and emitter regions are spaced apart from each other by a predetermined interval;

forming an opening by selectively removing the epitaxial layer such that a surface of the first conductive buried layer is partially exposed;

forming a first conductive diffusion region in a surface of the first conductive buried layer corresponding to the opening;

forming an interlayer dielectric layer on an entire surface of the silicon substrate; and forming contact holes simultaneously by selectively removing the interlayer dielectric layer such that the surfaces of the base region, the emitter region and the first conductive diffusion region are exposed;

wherein:

the contact hole for the first conductive diffusion region has a width wider than a width of the opening and the remaining contact hole;

and forms a step structure.

4. The method as claimed in claim 3, further comprising a step of forming base, emitter and collector electrodes electrically connected to the base region, the emitter region, and the first conductive diffusion region through the contact holes, respectively.

5. The method as claimed in claim 4, wherein a width of the collector electrode in the opening is narrower than a width of the collector electrode in the contact hole.

* * * * *